United States Patent [19]

Dolivo et al.

[11] Patent Number: 5,060,088
[45] Date of Patent: Oct. 22, 1991

[54] ADAPTIVE EQUALIZATION FOR RECORDING SYSTEMS USING PARTIAL-RESPONSE SIGNALING

[75] Inventors: Francois B. Dolivo, Wädenswil; Sedat Oelcer, Thalwil, both of Switzerland; Andreas Rüngeler, Benningen/Neckar, Fed. Rep. of Germany; Wolfgang H. Schott, Rüschlikon, Switzerland

[73] Assignee: International Business Machines Corporation, Armonk, N.Y.

[21] Appl. No.: 372,722

[22] Filed: Jun. 28, 1989

[30] Foreign Application Priority Data

Oct. 17, 1988 [EP] European Pat. Off. ........ 88810705.9

[51] Int. Cl.$^5$ .......................... G11B 5/09; G11B 5/035
[52] U.S. Cl. ......................................... 360/46; 360/65
[58] Field of Search ....................... 360/46, 65; 333/18

[56] References Cited

U.S. PATENT DOCUMENTS

| | | | |
|---|---|---|---|
| 3,949,206 | 4/1976 | Edwards et al. | 333/18 |
| 3,984,789 | 10/1976 | Luvison et al. | 333/18 |
| 4,475,211 | 10/1984 | Mattis, Jr. et al. | 333/18 |
| 4,580,176 | 4/1986 | Graves et al. | 360/45 |
| 4,847,797 | 7/1989 | Picchi et al. | 333/18 |

OTHER PUBLICATIONS

IEEE Transactions on Magnetics, vol. MAG-12, No. 6, Nov. 1976, "Improvement of Recording Density by Means of Cosine Equalizer", T. Kameyama, S. Takanami, and R. Arai, pp. 746-748.

IEEE Transactions on Communications, vol. COM-26, No. 10, Oct. 1978, "Application of Fast Kalman Estimation to Adaptive Equalization", David D. Falconer and Lennart Ljung, pp. 1439-1446.

IBM Technical Disclosure Bulletin, vol. 28, No. 11, Apr. 1986, "Adaptive Symmetrical Interference Equalization", pp. 4857-4858.

Primary Examiner—A. J. Heinz
Assistant Examiner—Varsha V. Sheladia
Attorney, Agent, or Firm—Henry E. Otto, Jr.

[57] ABSTRACT

The channel characteristics of magnetic-disk storage devices vary with track radius. An adaptive three-tap transversal equalizer that compensates these variations for systems using partial-response signaling is presented. The equalizer coefficients are updated by applying a procedure that is related to the recursive least-squares algorithm. This new updating procedure does not require multiplications and is well suited for high-speed implementation. Results obtained by computer simulations and measurements with a prototype have shown that the proposed adaptive equalizer can effectively compensate variations in magnetic-disk channel characteristics with track radius.

4 Claims, 5 Drawing Sheets

ADAPTIVE EQUALIZATION FOR RECORDING SYSTEMS USING PARTIAL-RESPONSE SIGNALING

FIELD OF THE INVENTION

This invention relates to methods and recording systems using partial-response signaling, e.g. magnetic disk storage systems or optical disk storage systems using partial-response signaling with maximum-likelihood sequence detection (PRML). The invention relates more particularly to a method for updating the tap coefficients of an equalizer in such systems, allowing compensation for the effect of channel characteristic variations with track radius, and to an equalizer for executing this method.

BACKGROUND OF THE INVENTION

In disk storage devices using partial-response (PR) signaling, a receive filter in the readback apparatus has to shape the output signal of the recording channel into a PR signal before a detection device, e.g. a maximum-likelihood sequence detector can reconstruct the recorded data sequence. However, since the recording density of data on a track, and thus the recording channel characteristic varies with track radius, a fixed filter can only shape the channel output signal into a nominal PR signal at a given track; at other radii, the spectrum of the filter output signal deviates from the nominal PR characteristic leading to a degradation in error-rate performance of the recording system. Such a loss in performance can be avoided if an adaptive equalizer is used besides the fixed receive filter, to compensate for variations in channel characteristics with track radius.

Various equalization circuits and methods for improving the operability and effectiveness of recording or communication systems are known in the art.

In the publication "Improvement of recording density by means of a cosine equalizer" by T. Kameyama et al., IEEE Transactions on Magnetics, Vol.MAG-12, No. 6 (November 1976), pp. 746-748, an equalizer was disclosed which improves the recording density in a peak detection magnetic recording system by pulse slimming. The equalizer consists of a delay line, an amplitude divider and a differential amplifier. However, the equalizer is not adaptively updated during reading data from the disk and thus cannot compensate channel characteristic variations.

An article by D. D. Falconer et al. entitled "Application of fast Kalman estimation to adaptive equalization", published in the IEEE Transactions on Communications, Vol.COM-26, No. 10 (October 1978), pp. 1439-1446, suggested employing, for setting of tap coefficients in an adaptive equalizer in data communication systems, a recursive least squares algorithm. This algorithm leads to rapid initial convergence of the equalizer tap coefficients. However, the algorithm requires a great number of multiplications and thus is not suited for high-speed implementation.

U.S. Pat. No. 4,580,176 entitled "Adaptive equalization circuit for magnetic recording channels utilizing signal timing", and the article "Adaptive symmetrical interference equalization" by R. C. Schneider et al., IBM Technical Disclosure Bulletin Vol. 28, No. 11 (April 1986), pp. 4857-4858, disclose adaptive equalizer circuits for magnetic recording systems. However, they are designed for peak detection systems and thus are not suited for recording systems using partial-response signaling.

OBJECTS OF THE INVENTION

It is a primary object of the invention to compensat channel characteristic variations with track radius i recording systems using partial-response signaling.

It is a further object of this invention to provide a ta coefficient adjustment method for an equalizer of recording system using partial-response signaling, b which the effect of channel characteristic variation with track radius is minimized.

Another object of the invention is to provide cir cuitry for the adaptive adjustment of the equalizer ta coefficients which is well suited for high-speed imple mentation.

A further object is a method of equalizer tap coeffici ent adjustment which enables a fast start-up of th equalizer circuitry in recording systems using partial response signaling.

SUMMARY OF THE INVENTION

These objects are achieved by a method for tap coef ficient adjustment in an equalizer of a recording systen using partial-response signaling, as defined in claim 1 and claim 6, and by equalizer apparatus for executing this method as defined in claim 7.

The invention compensates the effects of varying channel characteristics due to varying radius in record ing systems using PR signaling, and allows fast initia adjustment (during training sequence reception) anc reliable updating (during data reception) of the equal izer coefficients. Since only logic operations and n( multiplications are necessary to update the tap coeffici ents, the equalizer is well suited for high-speed imple mentation.

Further features and advantages of the invention wil become apparent from the following detailed descrip tion of a preferred embodiment in connection with the accompanying drawings.

DESCRIPTION OF PREFERRED EMBODIMENT

1. PRML System with ACE

The invention is described for sake of illustratior applied to a disk storage system having the following characteristics: It is a magnetic recording system using partial-response class-IV signaling with maximum- likelihood sequence detection (PRML).

Figure 1:
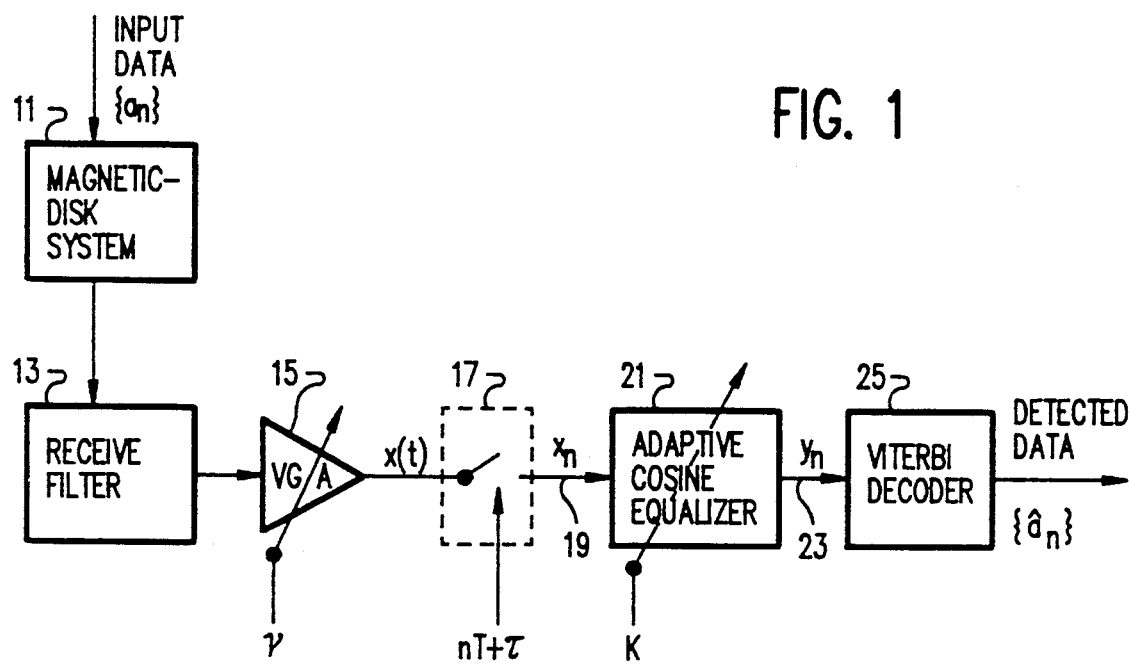
FIG. 1 is a schematic overview of a PRML recording system with an adaptive cosine equalizer (ACE)

A PRML system with an adaptive cosine equalizer (ACE) is shown in FIG. 1. A binary data sequence $\{a_n = \pm 1\}$ is sent at the signaling rate 1/T through a magnetic-disk storage system 11, band-limiting receive filter 13, and variable gain amplifier (VGA) 15 with gain $\gamma$. The output of VGA 15 is sampled by sampling means 17, e.g. an analog-to-digital converter, at times $nT+\tau$ and the resulting samples $x_n$ appearing on line 19 are processed by ACE 21. ACE 21 is a symmetric 3-tap digital equalizer with a center-tap value set to one. The other two taps are adjustable and have the same value K. The ACE will be described in more detail later. VGA 15 and ACE 21 together constitute a 3-tap transversal filter with coefficients $\gamma K$, $\gamma$, and $\gamma K$. The output samples $y_n$ appearing on the output lines 23 of the ACE are processed by Viterbi decoder 25 to reconstruct the recorded data sequence.

For a PR-IV signaling scheme, $$y_n = z_n + w_n, \tag{1}$$

where $$z_n = a_n - a_{n-2} \tag{2}$$

represents the signal part and $w_n$ is filtered noise. The fixed receive filter can shape the output of the magnetic-disk channel into the form described by (1) and (2) only at a given track radius. By adjusting the gain $\gamma$ and ACE coefficient K, this form can be closely approximated at other track radii.

The effectiveness of the ACE to compensate variations of the magnetic-disk channel characteristics with track radius will be shown using a model of these variations derived from measurements. Following this model, the overall transfer characteristic of the magnetic-disk channel and receive filter is given by $$C(f) = \eta C_0(f) e^{\Delta/2} e^{-2T\Delta|f|}, \tag{3}$$

where $$C_0(f) = \begin{cases} T[1 - e^{-j4\pi fT}] & \text{for } |f| < 1/2T \\ 0 & \text{otherwise,} \end{cases} \tag{4}$$

is the transfer characteristic of a PR-IV system. In (3), the gain parameter $\eta$ and the distortion parameter $\Delta$ model deviations from the PR-IV transfer characteristic caused by variations of the magnetic-disk channel characteristics with track radius. The term $e^{\Delta/2}$ in (3) normalizes the transfer characteristic $C(f)$ so that at $f = \frac{1}{4}T$, $C(\frac{1}{4}T) = \eta 2T$ is independent of the distortion parameter $\Delta$.

2. Cosine Equalizer

Figure 2:
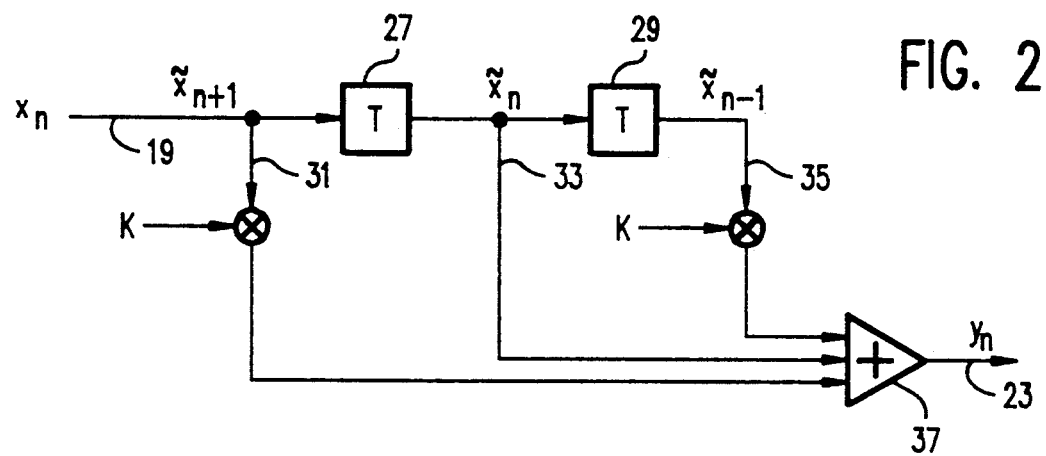
FIG. 2 is a basic block diagram of the cosine equal izer.

A block diagram of a cosine equalizer is shown in FIG. 2. It comprises a delay line having two delay elements 27, 29 and three taps 31, 33, 35. The sample of the center tap and modified samples of the two outer taps, each of them weighted with tap coefficient K, are combined in an adder 37 to form output sample $y_n$. The output sample $y_n$ is given by $$y_n(K) = x_n + K u_n, \tag{5}$$

where $$x_n = \tilde{x}_{n-1} \tag{6}$$

denotes the sample at the center of the delay line and $$u_n = \tilde{x}_{n+1} + \tilde{x}_{n-1}. \tag{7}$$

The filter described by (5) and (7) with $\tilde{x}_n$ as input has no phase shift; its transfer function is $$H(f) = 1 + 2K \cos(2\pi fT). \tag{8}$$

The transfer function of a reference equalizer that exactly compensates variations in channel characteristics for the model described by (3) and (4) is given by $$H_0(f) = e^{-\Delta/2} e^{2T\Delta|f|}. \tag{9}$$

Figure 3:
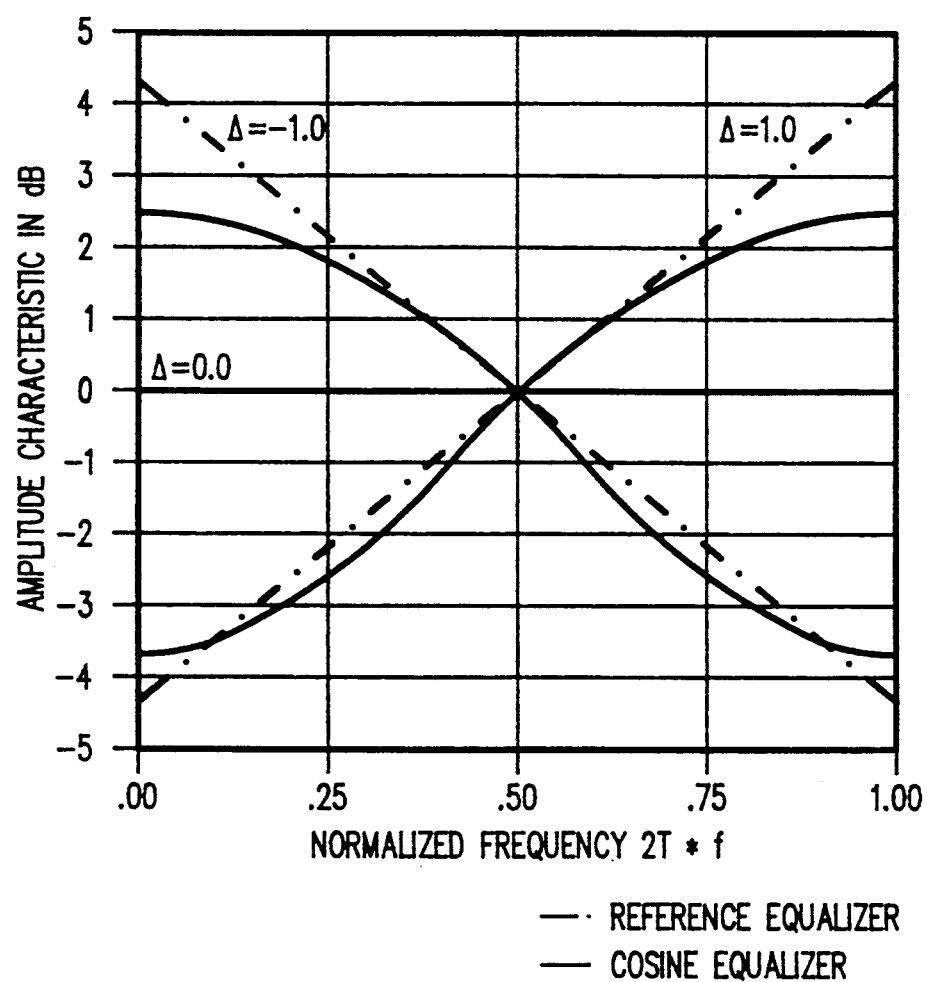
FIG. 3 is a diagram giving amplitude spectra of the cosine equalizer and of the ideal reference equalizer.

FIG. 3 shows the amplitude spectrum $|H(f)|$ of the cosine equalizer compared to $|H_0(f)|$ of the reference equalizer for three distortion parameters $\Delta$. The value of the VGA gain $\gamma$ is chosen such that $\eta\gamma = 1$ and the coefficient K is selected to minimize the mean-squared error at the input of the Viterbi decoder 25. The discrepancy between $|H(f)|$ and $|H_0(f)|$ at DC and the Nyquist frequency does not result in a large mean-squared error since PR-IV signaling leads to spectral nulls at these frequencies.

3. Tap Adjustment Procedure

The tap adjustment scheme is derived from the fast recursive least squares (RLS) algorithm for the estimation of the optimal tap coefficient (as described in the paper by Falconer et al. mentioned above). At time $n+1$ the tap coefficient $K_{n+1}^{RLS}$ obtained by the RLS method is the tap value K that minimizes the cumulative squared error $$\sum_{m=0}^{n} e_m^2(K), \tag{10}$$

where $$e_m(K) = y_m(K) - \hat{z}_m \tag{11}$$

represents the error signal at the output of the cosine equalizer with tap coefficient K and $z_m$ denotes a reconstruction of $z_m$ (see (2)) made by the receiver. The tap coefficient $K_{n+1}^{RLS}$ can be generated recursively as follows (RLS algorithm):

$$K_{n+1}^{RLS} = K_n^{RLS} - \xi_n e_n(K_n^{RLS}) u_n \tag{12}$$

$$K_0 = 0, \tag{13}$$

where $$\xi_n = \frac{1}{\sum_{m=0}^{n} u_m^2} \tag{14}$$

is a time varying loop gain.

The signal sample $z_n$ (2) can only have the values $0, \pm 2$ and (1) suggests reconstructing the three-level sample as $$\hat{z}_n = \begin{cases} 2 & \text{for } 1 \leq y_n \\ 0 & \text{for } -1 < y_n < 1 \\ -2 & \text{for } y_n \leq -1. \end{cases} \tag{15}$$

The term $e_n u_n$ in (12) is recognized as the stochastic gradient $\frac{1}{2} de_n^2(K_n)/dK_n$ of the mean squared error $E[e_n^2(K_n)]$ with respect to the tap coefficient $K_n$. Computation of this gradient requires a multiplication that can be avoided by using, according to the invention, instead of $u_n$ the three-level reconstruction $$\hat{u}_n = \begin{cases} 2 & \text{for } 1 \leq u_n \\ 0 & \text{for } -1 < u_n < 1 \\ -2 & \text{for } u_n \leq -1. \end{cases} \quad (16)$$

This approximation is justified by noticing that when the signal at the output of the receive filter 13 already has the PR-IV format, leading to K=0, then (see (1), (2), (5), and (7))

$$u_n = y_{n+1} + y_{n-1} = \quad (17)$$

$$a_{n+1} - a_{n-3} + w_{n+1} + w_{n-1} = \begin{cases} 2 + \text{noise} \\ 0 + \text{noise} \\ -2 + \text{noise}. \end{cases}$$

An approximate tap gradient can now be computed without multiplication. It is advantageous to compute the sum of two consecutive gradients in order to reduce variance. This leads to $$\Delta K_n = e_n(K_n)\hat{u}_n + e_{n-1}(K_{n-1})\hat{u}_{n-1}. \quad (18)$$

This gradient is used to update the tap coefficient by:

$$K_{n+1} = K_n - \xi \Delta K_n. \quad (19)$$

In the RLS algorithm (12), the loop gain $\xi_n$ computed by (14) decreases at every iteration. A simpler method that approximates this behavior is used for the modified algorithm (19). The loop gain $\xi$ is first set to a high value $\xi_H$ for fast initial adjustment of the tap coefficient and then lowered to a value $\xi_L$ to reduce fluctuations in the tap adjustment caused by noise. The modified algorithm can track variations in channel characteristics, which is not the case for the RLS algorithm given that $\xi_n \to 0$ as $n \to \infty$. The simpler method of switching the loop gain once instead of changing it according to (14) does not result in a loss of convergence speed.

Initial adjustment of the tap coefficient can be accelerated by transmitting a training sequence which consists of the repeated 18-bit long sequence:

$$\begin{array}{l} \ldots \\ +1+1-1+1+1-1-1-1+1+1+1+1-1- \\ -1+1-1-1\ldots \end{array} \quad (20)$$

Transmitting this sequence leads to well decoupled adjustments of the VGA gain and tap coefficient. Correct timing phase adjustment is also maintained.

4. Structure of an Adaptive Cosine Equalizer Embodying the Invention

Figure 4:
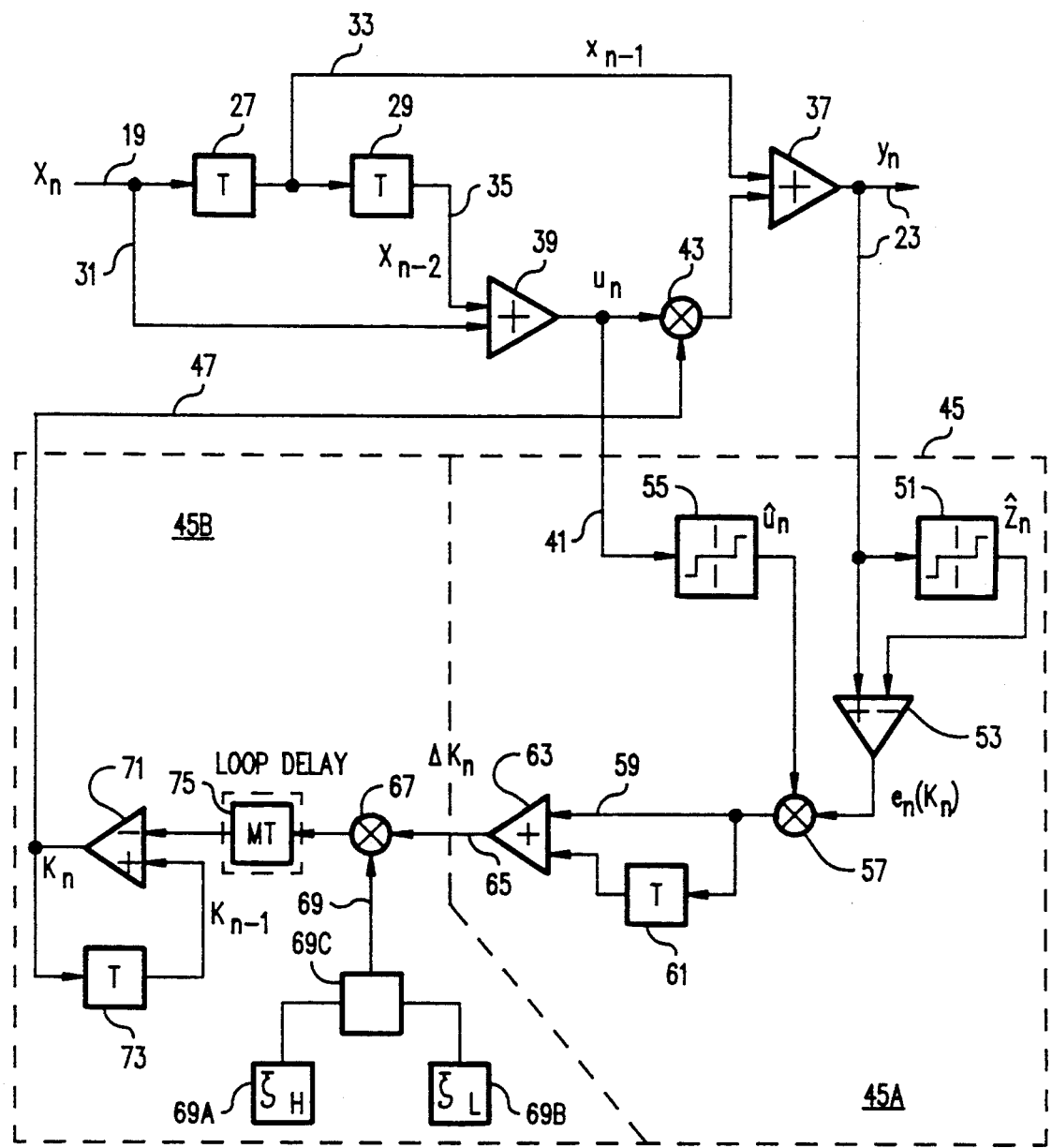
FIG. 4 is a block diagram of the adaptive cosine equalizer with tap coefficient adjustment circuitry according to the invention.

FIG. 4 shows the block diagram of an adaptive cosine equalizer which consists of a basic cosine equalizer and tap coefficient adjustment means implementing the tap coefficient updating method represented by equations (18) and (19).

ACE 21 includes: a delay line, comprising two delay elements 27 and 29 and having two outer taps 31, 35 and a center tap 33, the first outer tap being connected to line 19 for receiving the input sample $x_n$; an adder 39 for combining the samples $x_n$ at tap 31 and $x_{n-2}$ at tap 35 to provide their sum $u_n$ on line 41; multiplying means 43 for multiplying sample sum $u_n$ by tap coefficient $K_n$; an adder 37 for adding the product $K_n u_n$ to the sample $x_{n-1}$ appearing at the center tap of the delay line, for generating the output sample $y_n$ on output line 23; and a tap coefficient adjustment means 45 having two inputs connected to lines 23 and 41 for receiving $y_n$ and $u_n$, and an output furnishing the tap coefficient $K_n$ on line 47.

The tap coefficient adjustment means 45 is an important feature of the adaptive equalizer 21 embodying the invention. Means 45 comprises the following elements in its first portion 45A (which furnishes tap coefficient gradient $\Delta K_n$):

a quantizer 51 connected to output line 23 for receiving output sample $y_n$, and furnishing on its output a reconstructed sample $z_n$ of the nominal PR-IV sample $z_n$ which is either 2, 0, or −2 according to (15);

subtracting means 53 connected to receive the output sample $y_n$ from line 23 and the reconstructed sample $z_n$ from the output of quantizer 51, respectively, and furnishing their difference as error value $e_n(K_n)$ on its output;

a quantizer 55 connected to line 41 for receiving the sample sum $u_n$ of the samples $x_n$ and $x_{n-2}$ and furnishing on its output the reconstructed sum $\hat{u}_n$ which is a reconstruction of the sum of the nominal PR-IV samples $z_n$ and $z_{n-2}$, and which is either 2, 0, or −2 according to (16);

combining means 57 connected to the output of subtracting means 53 and of quantizer 55 for receiving $e_n(K_n)$ and $\hat{u}_n$, and furnishing at its output 59 the product of both. However, instead of an explicit multiplication, only a selection from the three values $-2e_n(K_n)$, 0, or $+2e_n(K_n)$ need to be made because the reconstructed sum $\hat{u}_n$ is ternary.

a delay element 61 connected to the output of combining means 57 for delaying the respective output value by one sampling period T;

an adder 63 connected to the outputs of combining means 57 and of delay element 61, for producing at its output 65 tap coefficient gradient $\Delta K_n$ in accordance with (18).

Tap coefficient adjustment means 45 further comprises (as shown in the second portion 45B in FIG. 4):

multiplication means 67 for multiplying the tap coefficient gradient $\Delta K_n$ furnished on line 65, by a loop gain $\xi$ applied to input 69. This loop gain $\xi$ assumes first the higher and then the lower of two preselected values $\xi_H$ (69A) and $\xi_L$ (69B), the switchover (69C) between these two values being performed at a predetermined time. Good values for the two loop gain factors and the switchover time can be determined either by simulation or by trial operation of the circuitry. It should be noted that no explicit multiplication is required when the loop gain $\xi$ is a multiple power of two; then the loop gain can be adjusted by changing the weight of all bits of the gradient $\Delta K_n$ (shifting).

subtracting means 71 for forming a new equalizer tap coefficient $K_n$ from a previous tap coefficient $K_{n-1}$ and the weighted gradient $\xi \Delta K_{n-M}$, furnishing the new tap coefficient on line 47;

a delay element 73 connected to line 47, for delaying the equalizer tap coefficient $K_n$ by one sampling period and for furnishing its output $K_{n-1}$ to subtracting means 71.

A loop delay shown at 75 in FIG. 4 has been introduced in the tap adjustment means 45 to represent the inherent signal processing delay caused by the time required to compute a gradient $\Delta K_n$ and update the equalizer tap coefficient. In FIG. 4 a loop delay of M of sampling periods T is shown. The delay elements are of course not concentrated at one location as shown in FIG. 4 but distributed as single pipeline registers at proper locations in the digital realization of means 45. The number M depends on the signaling rate 1/T and on the technology used to realize the ACE.

5. Digital Implementation of the Adaptive Cosine Equalizer

A digital implementation of the cosine equalizer 21 and the first portion (45A) of the tap coefficient adjustment means 45 will now be described. A digital realization of the second portion (45B) shown in FIG. 4 is straightforward and will not be discussed.

Figure 5:
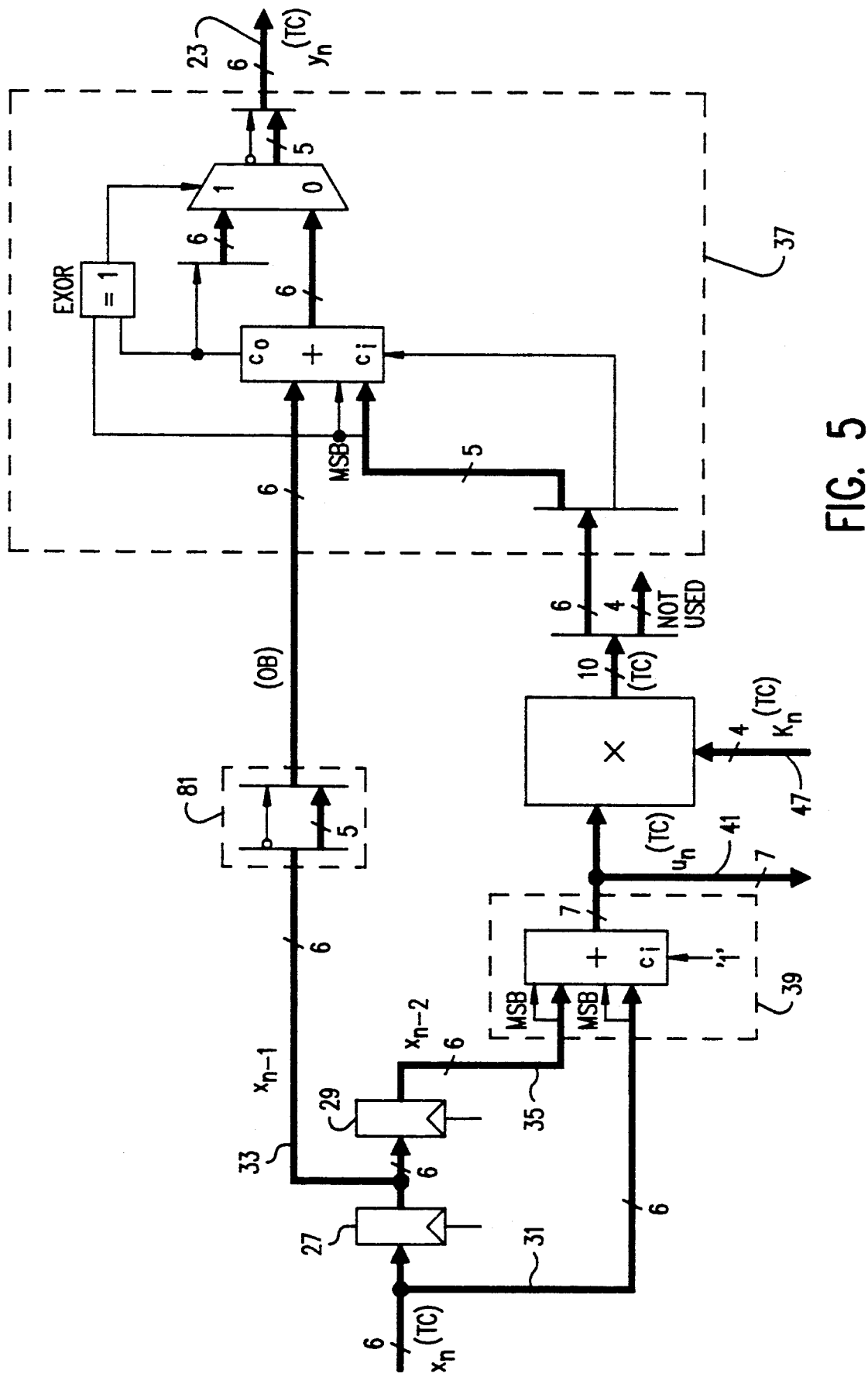
FIG. 5 is a block diagram of a digital implementatior of the basic cosine equalizer.

FIG. 5 shows the circuit implementation of the basic cosine equalizer. The input sample $x_n$ is quantized with six bits and represented in two's complement (TC) form. The weight of its least significant bit (LSB) is 0.125. It should be noted that the amount of half an LSB has to be added to the sample $x_n$ to compensate a displacement intentionally introduced by the analog-to-digital converter adjustment. In principle, this can be done at once by physically introducing a "seventh" bit with weight $2^{-4}$ which is always set to '1'. However, to simplify significantly the hardware design by taking advantage of this representation, the correction term is not added before some other operations are performed on the received bits. A 7-bit full adder is used to compute the sample $u_n = x_n + x_{n-2}$. At this stage the "seventh" bit with weight $2^{-4}$ of $x_n$ and $x_{n-2}$ is taken into account. The sample $u_n$ is multiplied by the tap coefficient $K_n$. $K_n$ is quantized with 4 bits and its absolute value is limited to 0.25. The product is quantized with 6 bits and sign extended before being added to the sample $x_{n-1}$ represented in offset binary (OB) form. Element 81 converts the sample $x_{n-1}$ appearing on line 33 from TC form to OB representation. The resulting sum is furnished in offset binary representation because a TC and OB number are added. In case of underflow or overflow the output saturates to its minimum or maximum value. The saturation circuit consists of one EXOR gate and a multiplexer. It is activated when the most significant bit (MSB) of the TC sample at the input of adder 37 does not equal the carry output $c_o$ of the adder; in this case the carry determines the saturation value. The equalizer output sample $y_n$ is represented in the same form as the received sample $x_n$.

Figure 6:
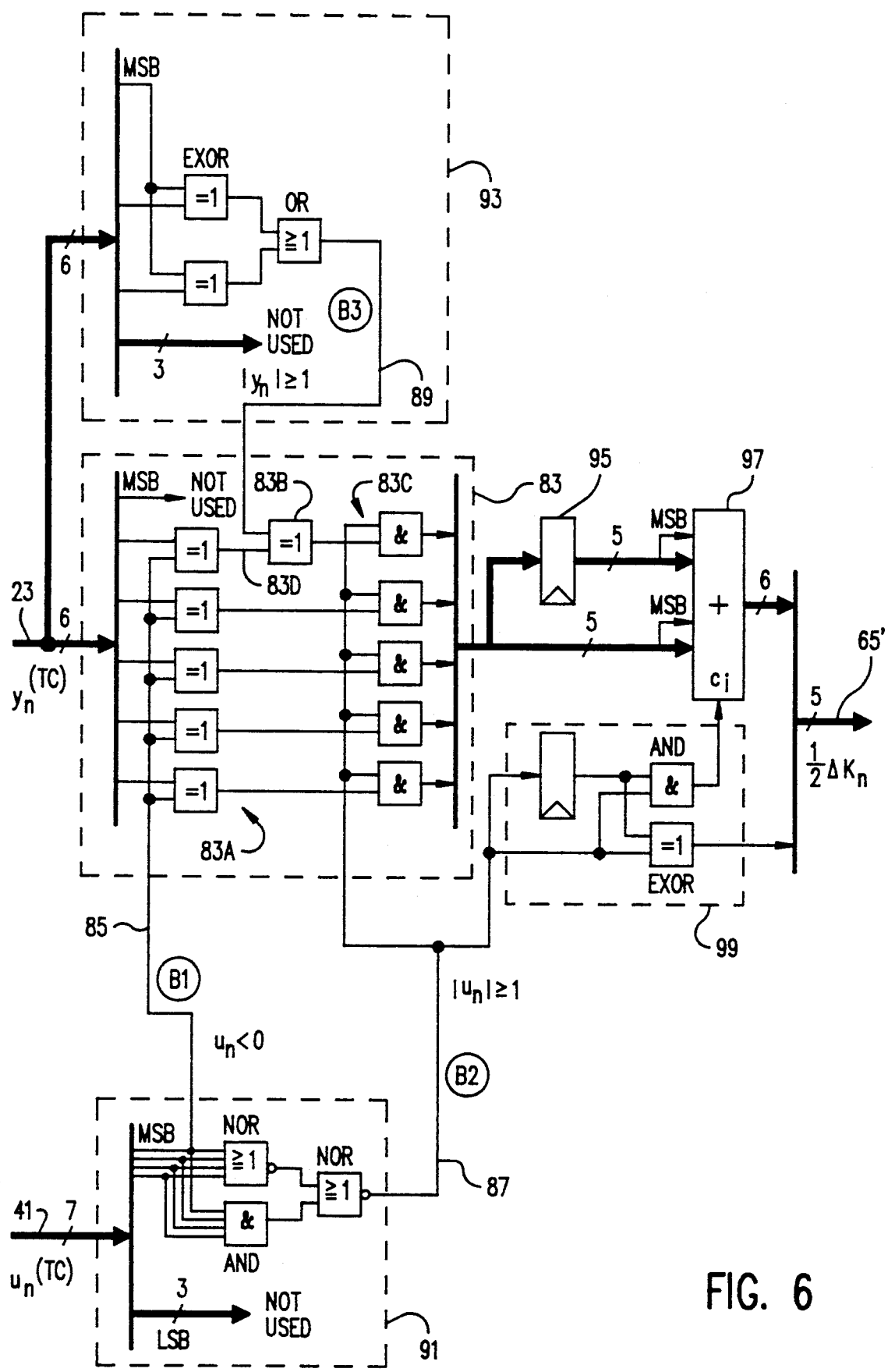
FIG. 6 is a block diagram of a digital implementatior of the tap coefficient gradient ($\Delta K_n/2$) computation.

Circuitry for a digital implementation of the first portion 45A of tap coefficient adjustment means 45 (see FIG. 4) is shown in FIG. 6. Both input samples $y_n$ and $u_n$ are represented in two's complement form and are provided by the cosine equalizer (see FIG. 5) on lines 23 and 41. Relations (11), (15) and (16) show that the term $e_n u_n/2$ can be computed as follows:

$$\frac{e_n u_n}{2} = \begin{cases} y_n - 2 & \text{for } u_n \geq 1 \text{ and } y_n \geq 1 \\ y_n & \text{for } u_n \geq 1 \text{ and } |y_n| < 1 \\ y_n + 2 & \text{for } u_n \geq 1 \text{ and } y_n \leq -1 \\ 0 & \text{for } |u_n| < 1 \\ -y_n + 2 & \text{for } u_n \leq -1 \text{ and } y_n \geq 1 \\ -y_n & \text{for } u_n \leq -1 \text{ and } |y_n| < 1 \\ -y_n - 2 & \text{for } u_n \leq -1 \text{ and } y_n \leq -1. \end{cases} \quad (21)$$

Since its absolute value is less than or equal to 1.9375, it can be represented by five bits. Its computation using a simple EXOR/AND circuit combination is shown in portion 83 of FIG. 6. This portion includes a group of five EXOR gates 83A, one additional EXOR gate 83B, and a group of five AND gates 83C. Its output signal is determined by a binary control signal B1 indicating when $u_n < 0$, by a binary control signal B2 indicating when $|u_n| \geq 1$, and by a binary control signal B3 indicating when $|y_n| \geq 1$. These binary control signals appear on lines 85, 87, and 89, respectively. Their derivation from the incoming samples is shown in portions 91 and 93 of FIG. 6. Depending on the sign of $u_n$ (represented by the signal B1 on line 85), the five EXOR gates 83A invert or keep unchanged the five least significant bits of the sample $y_n$. If $|y_n| \geq 1$ (as indicated by the signal B3 on line 89), either the value +2 or -2 is added to $y_n$ by inverting the bit on line 83D with the aid of EXOR gate 83B. If $|u_n| < 1$ (as indicated by the signal B2 on line 87), the output is forced to be zero by overwriting the EXOR output signals with zeros using the group of AND gates 83C. Two succeeding terms $e_n u_n/2$ (one delayed by a delay element 95) are added in a 6-bit adder 97. Two additional gates and a delay element, as shown at 99 in FIG. 6 below the full adder 97, consider the "seventh" bit with weight 0.0625 of the two successive samples to be added. The resulting sum $\Delta K_n/2$ on line 65' is fed to the tap coefficient accumulator as shown in FIG. 4.

While the invention has been shown and described with reference to a preferred embodiment thereof, it will be understood by those skilled in the art that various changes in form and detail may be made without departing from the scope and teaching of the invention. Accordingly, the apparatus and method herein disclosed are to be considered merely as illustrative, and the invention is to be limited only as specified in the claims.

We claim:

1. Equalizer apparatus having an input for receiving digital data and an output comprising:
   delay line means (27,29) comprising two delay elements and having a first outer tap (31) connected to the input (19) of the equalizer, a center tap (33), and a second outer tap (35);
   first adding means (39) connected to the first and second outer taps, for providing on its output (41) a sample sum $u_n$;
   multiplying means (43) connected to the output of said first adding means and to a tap coefficient line (47), for providing on its output an intermediate value;
   second adding means (37) connected to said center tap and to the output of said multiplying means, for furnishing to the equalizer output (23) an equalizer output sample $y_n$; and tap coefficient adjustment means (45) having two inputs connected to the outputs (41,23) of said first and second adding means, and having an output connected to said tap coefficient line (47), said tap coefficient adjustment means including:
 (i) tap coefficient gradient generation means (45A) for receiving said sample sum $u_n$ and said equalizer output sample $y_n$ from the outputs (41,23) of said first and second adding means, respectively, for furnishing on its output (65) a tap coefficient gradient $\Delta K_n$; and
 (ii) tap coefficient updating means (45B) connected to said tap coefficient gradient generation means for receiving said tap coefficient gradient $\Delta K_n$, and furnishing a tap coefficient $K_n$ to said tap coefficient line (47).

2. The apparatus of claim 1, wherein said tap coefficient gradient generation means (45A) comprises combinational logic circuitry (83, 91, 93) for generating a quantity $A_n$ in response to said sample sum $u_n$ and said equalizer output sample $y_n$ according to the rule $$A_n = \begin{cases} y_n - 2 & \text{for } u_n \geq 1 \text{ and } y_n \geq 1 \\ y_n & \text{for } u_n \geq 1 \text{ and } |y_n| < 1 \\ y_n + 2 & \text{for } u_n \geq 1 \text{ and } y_n \leq -1 \\ 0 & \text{for } |u_n| < 1 \\ -y_n + 2 & \text{for } u_n \leq -1 \text{ and } y_n \geq 1 \\ -y_n & \text{for } u_n \leq -1 \text{ and } |y_n| < 1 \\ -y_n - 2 & \text{for } u_n \leq -1 \text{ and } y_n \leq -1; \end{cases}$$

and delay means (95) and adding means (97) connected to the output of said combinational logic circuitry, for generating a tap coefficient gradient according to the rule $\Delta K_n / 2 = A_n + A_{n-1}$.

3. The apparatus of claim 1, wherein said tap coefficient updating means (45B) comprises means (67, 69, 69A, 69B) for executing shift operations on said tap coefficient gradient $\Delta K_n$, resulting in a multiplication of said tap coefficient gradient initially by one value, and subsequently after a predetermined number of sampling intervals T by another value of two predetermined loop gain values, each of said two loop gain values being a multiple power of 2.

4. In a disk recording system using partial response signalling with maximum likelihood sequence detection, a method of adaptively compensating for the effect of variations in characteristics of the channel due to differences in radius and hence recording density of the respective tracks of the recording disk, comprising the steps of:

providing an equalizer comprising a delay line with one outer tap for receiving a digital data signal, a center tap and a second outer tap;

adding (39) to said digital data signal a delayed digital data signal supplied via said outer taps, for providing as an output (41) a sample sum $u_n$;

multiplying (43) said sample sum $u_n$ and a signal $K_n$ from a tap coefficient line (47), for providing as an output an intermediate value;

adding (37) a signal supplied via said center tap to said intermediate value, for providing as an output (23) from the equalizer an output sample $y_n$;

providing a tap coefficient gradient generation means (45A) for receiving said sample sum $u_n$ and said equalizer output sample $y_n$ for furnishing as its output (65) a tap coefficient gradient $\Delta K_n$; and updating the tap coefficient gradient $\Delta K_n$, and furnishing the tap coefficient signal $K_n$ to the tap coefficient line (47), thereby to adaptively compensate for variations in channel characteristics with track radius.

* * * * *

UNITED STATES PATENT AND TRADEMARK OFFICE
CERTIFICATE OF CORRECTION

PATENT NO. : 5,060,088

DATED : Oct. 22, 1991

INVENTOR(S) : Dolivo et al.

It is certified that error appears in the above-indentified patent and that said Letters Patent is hereby corrected as shown below:

Column 3, line 61 delete Formula 5, insert -- $y_n(K) = \tilde{x}_n + K\ u_n$ --.

Column 3, line 65 delete Formula 6, insert -- $\tilde{x}_n = x_n - 1$ --.

Column 4, line 31, delete whole line, insert -- n+1 the tap coefficient $K_{N+1}^{RLS}$ obtained by the RLS--.

Column 4, line 43, delete whole line, insert -- equalizer with tap coefficient K and $\hat{z}_m$ denotes a reconstruction --.

Column 4, line 45, delete whole line, insert --

Coefficient $K_{N+1}^{RLS}$ can be generated recursively as --.

UNITED STATES PATENT AND TRADEMARK OFFICE
CERTIFICATE OF CORRECTION

PATENT NO. : 5,060,088
DATED : Oct. 22, 1991
INVENTOR(S) : Dolivo et al.

It is certified that error appears in the above-indentified patent and that said Letters Patent is hereby corrected as shown below:

Column 4, line 54 delete Formula 14, insert -- $\xi_n = \dfrac{1}{\sum_{m=0}^{n} u_m^2}$ --.

Column 5, line 2, delete " $de_{n^2}$ ", insert -- $de_n^2$ --.

Column 5, line 3, delete whole line, insert --

$E[e_n^2(K_n)]$ with respect to the coefficient $K_n$. Com- --.

Column 6 line 19, delete " $z_n$ ", insert -- $\hat{z}_n$ --.

Column 6, line 24, delete " $z_n$ ", insert -- $\hat{z}_n$ --.

Column 6, line 29, delete " $u_n$ ", insert -- $\hat{u}_n$ --.

Column 6, line 36 delete " $u_n$ ", insert -- $\hat{u}_n$ --.

Column 6, line 40 delete " $u_n$ ", insert -- $\hat{u}_n$ --.

UNITED STATES PATENT AND TRADEMARK OFFICE
CERTIFICATE OF CORRECTION

PATENT NO. : 5,060,088
DATED : Oct. 22, 1991
INVENTOR(S) : Dolivo et al.

It is certified that error appears in the above-indentified patent and that said Letters Patent is hereby corrected as shown below:

Column 7, line 68, delete " $e_n u_n/2$ ", insert -- $e_n \hat{u}_n/2$ --.

Column 8, line 6, delete " $\dfrac{e_n u_n}{2} =$ ", insert -- $\dfrac{e_n \hat{u}_n}{2} =$ --.

Column 8, line 36, delete " $e_n u_n/2$ ", insert -- $e_n \hat{u}_n/2$ --.

Signed and Sealed this

Twenty-ninth Day of August, 1995

Attest:

BRUCE LEHMAN

Attesting Officer          Commissioner of Patents and Trademarks